United States Patent [19]
Dunlap et al.

[11] Patent Number: 5,436,597
[45] Date of Patent: Jul. 25, 1995

[54] PRO-CAPTURE CIRCUIT FOR PHASE LOCKED LOOP CIRCUITS

[75] Inventors: Frank M. Dunlap, Palo Alto; Vincent S. Tso, Milpitas, both of Calif.

[73] Assignee: Sierra Semiconductor Corporation, San Jose, Calif.

[21] Appl. No.: 272,837

[22] Filed: Jul. 11, 1994

[51] Int. Cl.[6] .................. H03L 7/095; H03L 7/10
[52] U.S. Cl. .................. 331/1 A; 331/14; 331/17; 331/25; 331/DIG. 2
[58] Field of Search ........... 331/1 A, 17, 25, DIG. 2, 331/14

[56] References Cited

U.S. PATENT DOCUMENTS

| | | | |
|---|---|---|---|
| 4,590,440 | 5/1986 | Haque et al. | 331/DIG. 2 |
| 4,853,642 | 8/1989 | Otani et al. | 331/4 X |
| 4,988,955 | 1/1991 | Horie | 331/11 |
| 5,304,953 | 4/1994 | Heim et al. | 331/1 A |

Primary Examiner—Siegfried H. Grimm
Attorney, Agent, or Firm—Burns, Doane, Swecker & Mathis

[57] ABSTRACT

A pro-capture circuit for a phase locked loop detects when the phase locked loop is operating outside of its operating range, and then forces the phase locked loop back into the proper range. The principle of detection is general and may be adapted to work in distinct phase locked loop designs. More particularly, the pro-capture circuit is used in a phase locked loop having a normal operating range in which an output signal of the phase locked loop varies between a minimum normal value and a maximum normal value. The pro-capture circuit includes circuitry for sensing when the output signal is outside the normal operating range and circuitry for forcing the output signal to reenter the normal operating range. In accordance with another embodiment, a phase locked loop includes a voltage controlled oscillator that produces an output signal of a controlled frequency in response to a voltage input signal, circuitry for sensing when the output signal is outside a normal operating range by sensing when the voltage input signal is outside a corresponding normal operating range, and circuitry for forcing the output signal to a predetermined level within the normal operating range by forcing the voltage input signal to a corresponding predetermined level within the normal operating range.

3 Claims, 2 Drawing Sheets

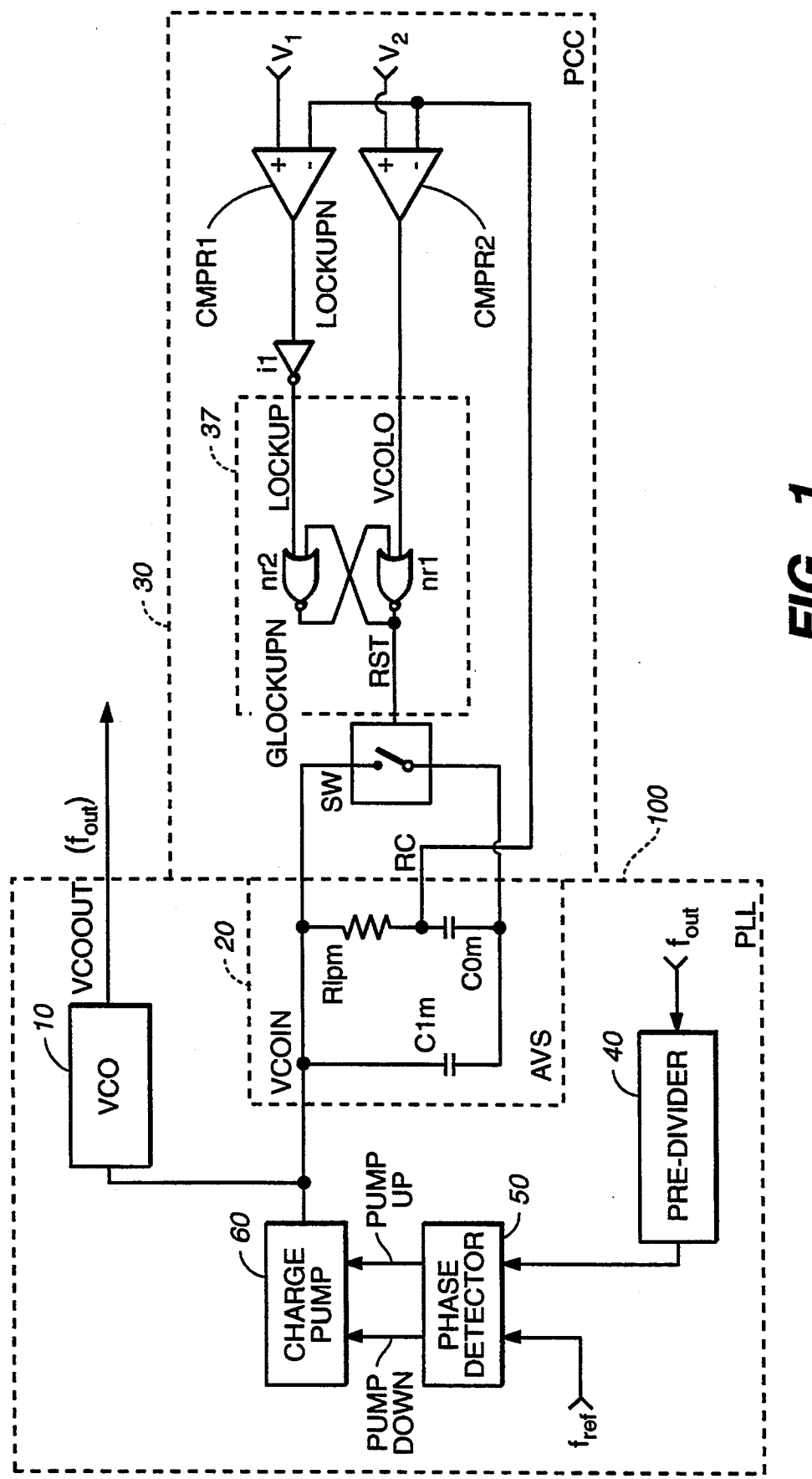
FIG._1

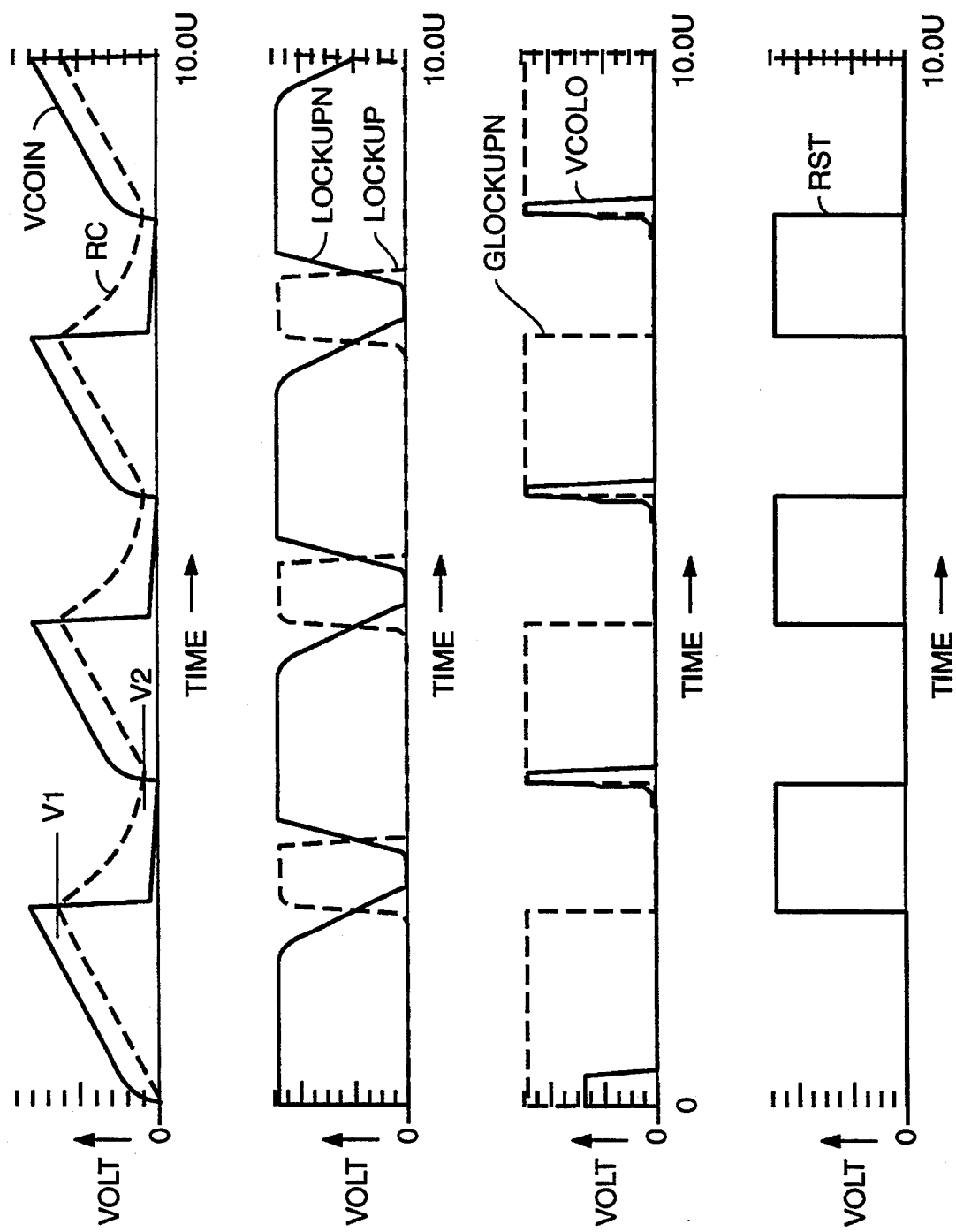

PRO-CAPTURE CIRCUIT FOR PHASE LOCKED LOOP CIRCUITS

BACKGROUND OF THE INVENTION

1. Field of the Invention

The present invention relates to phase locked loops, more particularly to acquisition aids in phase locked loops.

2. State of the Art

A phase locked loop (PLL) may be inadvertently forced to function outside its operating range because of a variety of factors. In some cases, once functioning outside of its operating range, the PLL may not be able to be driven back into the proper range even when system inputs suggest that it should. For example, within a PLL, a frequency pre-divider may be unable to function when its input, the voltage controlled oscillator (VCO) output of the PLL, reaches a very high frequency. The VCO's output may be operating at a very high frequency because the PLL has been incorrectly programmed. Nevertheless, when the PLL is subsequently reprogrammed, it is unable to recover and operate normally.

There are other cases in which the PLL can be inadvertently forced to function outside of its operating range. In the case described above, the errant behavior of the PLL caused the VCO to generate the highest frequency it could provide. In a different PLL architecture, the behavior of the circuit may be to produce the lowest frequency the circuit can provide.

What is needed, then, is a way to ensure that if a PLL does exceed its operating range, it is able to recover.

SUMMARY OF THE INVENTION

A pro-capture circuit (PCC) of the present invention, generally speaking, solves the foregoing problem by detecting when the PLL is operating outside of its operating range, and then by forcing the PLL back into the proper range. The principle of detection is general and may be adapted to work in distinct PLL designs as well as many other applications. More particularly, in accordance with one embodiment of the invention, the PCC is used in a PLL having a normal operating range in which an output signal of the PLL varies between a minimum normal value and a maximum normal value. The PCC includes circuitry for sensing when the output signal is outside the normal operating range, and circuitry for forcing the output signal to reenter the normal operating range. In accordance with another embodiment of the invention, a PLL includes a VCO that produces an output signal of a controlled frequency in response to a voltage input signal, circuitry for sensing when the output signal is outside a normal operating range by sensing when the voltage input signal is outside a corresponding normal operating range, and circuitry for forcing the output signal to a predetermined level within the normal operating range by forcing the voltage input signal to a corresponding predetermined level within the normal operating range.

BRIEF DESCRIPTION OF THE DRAWING

The present invention may be further understood from the following description in conjunction with the appended drawing. In the drawing:

FIG. 1 is a circuit diagram showing part of a PLL including a PCC in accordance with the present invention; and FIG. 2 through FIG. 5 are timing diagrams illustrating operation of the PCC of FIG. 1.

DETAILED DESCRIPTION OF THE PREFERRED EMBODIMENTS

Referring to FIG. 1, in a typical PLL 100, a reference frequency $f_{ref}$ is compared in a phase detector 50 to a clock signal derived from the output of a VCO 10 by means of a pre-divider 40, for example. The phase detector 50 produces and inputs to a charge pump 60 two output signals, a "pump up" signal active when the VCO-derived signal is lagging and a "pump down" signal when the VCO-derived signal is leading. The charge pump 60 in response sources current to, or sinks current from a loop filter 20. The loop filter 20 is connected to the VCO 10 and causes the VCO 10 to speed up or slow down as required in order to bring the reference frequency and the VCO-derived clock into coincidence. The loop filter 20 is shown in FIG. 1 as a C-RC filter having a first capacitor C1m connected in parallel with the series combination of a resistor R1pm and a second capacitor C0m. The loop filter 20, however, may in general be of any configuration.

A PCC 30 connected to the loop filter 20 detects when the PLL 100 is operating outside of its operating range and then forces the PLL 100 back into the proper range. In the illustrated embodiment, the PCC 30 indirectly monitors the voltage of the VCO input, VCOIN, by monitoring node RC directly in order to detect when the PLL 100 has exceeded its operating range. When the voltage of the node RC is driven above a certain level, V1, the PCC 30 responds by forcing VCOIN well within its normal operating range. If the conditions that forced the PLL 100 outside of its operating range have been removed, the PLL 100 should be able to recover and operate normally. If, on the other hand, the conditions remain, the PCC 30 will repeatedly force VCOIN to a predefined level until the offending conditions are removed.

The PCC 30 includes a switch SW connected between VCOIN and a reference voltage AVS and used to discharge the loop filter 20 when the PCC 30 detects that the PLL 100 is operating outside its normal operating range. A first comparator circuit cmpr1 monitors node RC and produces an active-low signal LOCKUPN when RC exceeds a predetermined threshold V1. The signal LOCKUPN is inverted in an inverter i1 to produce a signal LOCKUP, which is input to a flip-flop 37 consisting of a pair of cross-coupled NOR gates nr1 and nr2. The output of the flip-flop 37, RST, is connected to the switch SW and resets the PLL 100 by closing the switch SW and discharging the loop filter 20 until RC is well within the normal operating range of the PLL 100.

A second comparator circuit cmpr2 monitors RC and produces an active-high signal VCOLO when RC drops below a predetermined threshold V2. The signal VCOLO is input to a reset input of the flip-flop 37 and causes the output signal RST to go inactive. The switch SW is then opened, and the loop filter 20 is free to recharge as the PLL 100 attempts capture.

Because of the particular circuit arrangement of the loop filter 20, RC is monitored rather than monitoring VCOIN directly. If VCOIN were monitored directly, when the switch SW were turned on, VCOIN would immediately drop to near zero volts. If the switch SW were then turned off, however, VCOIN would then immediately jump up as a result of charge remaining in the large capacitor C0m, possibly defeating capture. By monitoring RC instead, the switch SW is not turned off until the capacitor C0m is fully discharged or nearly so.

Operation of the PCC of FIG. 1 may be further understood with reference to FIG. 2 through FIG. 5. A PLL was programmed so that its VCO output frequency, $f_{out}$, was extremely high and beyond the operating range of the other circuits of the PLL. As the PLL tried to lock by forcing the "pump up" input signal of the charge-pump circuit high, VCOIN was steadily charged up. At V1, the PCC detected the potential "run-away" condition and quickly discharged VCOIN down to AVS (0V). When VCOIN was forced below V2, VCOIN was released by the PCC and allowed to be controlled by the PLL. This charging and discharging cycle would continue until the PLL was reprogrammed to an in-range operating frequency where the PLL was able to lock.

More particularly, with the PLL programmed so that its VCO output frequency will exceed the operating range of the PLL, VCOIN alternately ramps up and drops quickly to near zero volts as the PLL attempts capture and is then reset (FIG. 2). RC ramps up similarly but, instead of dropping rapidly, ramps down more slowly. When RC exceeds V1, the comparator cmpr1 causes the signal LOCKUPN to go active-low (FIG. 3). The inverse signal, LOCKUP, sets the flip-flop 37 (FIGS. 4 and 5—the output of NOR gate nr2, GLOCK-UPN, goes active-low, causing the output of NOR gate nr1, RST, to go active-high). The switch SW is thereby closed, discharging the loop filter.

As the loop filter is discharged, RC ramps down below V1 and the comparator cmpr1 causes the signal LOCKUPN to go inactive-high. Some time later, as RC approaches zero volts, it goes below V2, at which time the comparator cmpr2 causes the signal VCOLO to be asserted active-high (FIG. 4). The state of the flip-flop 37 then "flips" with GLOCKUPN going inactive-high and RST going inactive-low (FIGS. 4 and 5). The switch SW is then opened, and the loop filter is allowed to recharge.

So long as the PLL has not been reprogrammed to an in-range value, the foregoing operational cycle will repeat. If the PLL is then reprogrammed to an in-range value, however, the PLL will achieve capture, and the voltage at the node RC will experience minimal variations while the PLL remains in lock.

The present pro-capture circuit (PCC) will find wide application in improving the robustness of PLL designs as well as many other design applications. The PCC is especially useful for high speed applications.

It will be appreciated by those of ordinary skill in the art that the invention can be embodied in other specific forms without departing from the spirit or essential character thereof. For example, although the PCC of FIG. 1 is single-ended in that it checks for an out-of-range condition only at the upper end of the operating range, the circuit may be easily modified to check for out-of-range conditions at both the upper and lower ends of the operating range, in which case the PCC will reset the PLL to a mid-range operating condition. Furthermore, although in the foregoing description the output signal from the VCO has been assumed to be the output of the PLL, in other applications (for example, an FM demodulator), the input signal to the VCO may constitute the output of the PLL.

The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

What is claimed is:

1. A phase locked loop comprising:
   a voltage controlled oscillator that produces an output signal of a controlled frequency in response to a voltage input signal;
   a loop filter that produces the voltage input signal to the voltage controlled oscillator;
   means for sensing when the output signal is outside a normal operating range by sensing when the voltage input signal is outside a corresponding normal operating range, and for sensing when the voltage input signal has reached a predetermined level within the normal operating range, said means for sensing comprising first and second comparator means; and
   means for forcing the output signal to a predetermined level within the normal operating range by discharging the loop filter, thereby forcing the voltage input signal to said predetermined level within the normal operating range.

2. The apparatus of claim 1, wherein the loop filter comprises the series combination of a resistor and a capacitor connected between the voltage input signal and the reference voltage.

3. The apparatus of claim 2, wherein the first and second comparator means are both connected to a node between the resistor and the capacitor.

* * * * *